US008653895B2

(12) United States Patent
deJong

(10) Patent No.: US 8,653,895 B2
(45) Date of Patent: Feb. 18, 2014

(54) CIRCUIT WITH REFERENCE SOURCE TO CONTROL THE SMALL SIGNAL TRANSCONDUCTANCE OF AN AMPLIFIER TRANSISTOR

(75) Inventor: Gerben Willem deJong, Veldhoven (NL)

(73) Assignee: NXP, B.V., Eindhoven (NL)

( * ) Notice: Subject to any disclaimer, the term of this patent is extended or adjusted under 35 U.S.C. 154(b) by 8 days.

(21) Appl. No.: 13/391,600

(22) PCT Filed: Aug. 19, 2009

(86) PCT No.: PCT/IB2009/053663
§ 371 (c)(1),
(2), (4) Date: Mar. 7, 2012

(87) PCT Pub. No.: WO2011/021070
PCT Pub. Date: Feb. 24, 2011

(65) Prior Publication Data
US 2012/0154050 A1 Jun. 21, 2012

(51) Int. Cl.
*H03F 3/04* (2006.01)
(52) U.S. Cl.
USPC .......................................... 330/296; 330/285
(58) Field of Classification Search
USPC ................... 330/278, 285, 296, 295
See application file for complete search history.

(56) References Cited

U.S. PATENT DOCUMENTS

| | | | |
|---|---|---|---|
| 5,777,518 A | 7/1998 | Bailey | |
| 6,025,792 A | 2/2000 | Smith | |
| 6,323,725 B1 | 11/2001 | Goldblatt et al. | |
| 7,786,805 B2 * | 8/2010 | Trauth et al. | 330/285 |
| 8,093,952 B2 * | 1/2012 | Behzad et al. | 330/288 |
| 8,319,560 B2 * | 11/2012 | Kocer et al. | 330/296 |
| 2002/0180533 A1 * | 12/2002 | Pehlke et al. | 330/296 |
| 2003/0234638 A1 | 12/2003 | Eshraghi et al. | |
| 2006/0103465 A1 | 5/2006 | Jiang et al. | |
| 2007/0075778 A1 | 4/2007 | Klemmer | |
| 2009/0072906 A1 * | 3/2009 | Tsurumaki et al. | 330/285 |

FOREIGN PATENT DOCUMENTS

| | | |
|---|---|---|
| WO | 02/087072 A2 | 10/2002 |
| WO | 2004/042782 A2 | 5/2004 |
| WO | 2007/103401 A1 | 9/2007 |

OTHER PUBLICATIONS

International Search Report and Written Opinion for Int'l Patent Application No. PCT/IB2009/053663 (Dec. 9, 2009).

* cited by examiner

*Primary Examiner* — Khanh V Nguyen

(57) ABSTRACT

A circuit has a reference source (12) for supplying a bias signal to set a small signal transconductance of an amplifier transistor in an amplifier (10) to a predetermined value. The reference source has at least one reference transistor (120*a-b*, 30). A feedback circuit (128, 129, 38) has an input coupled to the main current channel of the reference transistor or reference transistors (120*a-b*, 30) and an output coupled to the control electrode of the reference transistor or reference transistors (120*a-b*, 30). The feedback circuit controls a control voltage at the control electrode, so as to equalize an offset current and a difference between main currents flowing through the current channel of the reference transistor or reference transistors (120*a-b*, 30), obtained with and without a small voltage offset added to the control voltage. The main currents flowing with and without a small voltage offset may be obtained by using a first and second reference transistor (122*a,b*), matching each other and an offset voltage source (126) coupled between the control electrodes of the first and second reference transistor (122*a,b*), to apply the small voltage offset between their control electrodes.

10 Claims, 2 Drawing Sheets

CIRCUIT WITH REFERENCE SOURCE TO CONTROL THE SMALL SIGNAL TRANSCONDUCTANCE OF AN AMPLIFIER TRANSISTOR

FIELD OF THE INVENTION

The invention relates to a circuit that comprises a reference source.

BACKGROUND OF THE INVENTION

Integrated circuits contain transistors that amplify signals with amplification factors that depend on the bias settings of the transistors. It is known to control the bias setting of transistors in an integrated circuit with a reference source. Typically, a reference source is a circuit designed to supply a voltage or current with a minimal dependence on uncontrollable factors such as circuit temperature.

US patent application No 2007/0075778 discloses an example of a reference source that uses two field effect reference transistors in a control loop that keeps the drain currents of the reference transistors equal. The sizes of the reference transistors differ by ratio of N:1 and the gate source voltages differ by an offset proportional to the drain current. As a result, the drain current is adjusted to a level where the effect of the transfer size ratio and the gate-source voltage offset on the drain currents are equal and opposite.

A resulting gate source voltage and/or the resulting drain current may be used as a reference to set the bias of amplifying transistors in the integrated circuit. In this way external influences on the reference are minimized. The reference depends on the characteristics of the reference transistors, the resistance used to derive the offset from the drain current and the ratio of the sizes of the reference transistors, which can be accurately controlled.

For amplifier circuits it is desirable that the small-signal gain of transistors is controlled. The reference source of US patent application No 2007/0075778 controls the gain to a certain extent, because it provides a controlled reference voltage to an amplifier. However, this does not prevent unpredictable variation of the small-signal gain due to factors that affect the current and the gain in different ways.

SUMMARY OF THE INVENTION

Among others, it is an object to provide a circuit with a reference source where the predictability of small-signal gain in the circuit is improved.

A circuit according to claim 1 is provided. Herein one or more reference transistors are used in combination with a feedback circuit that regulates the control voltage of the one or more reference transistors so that the one or more reference transistors exhibit a predetermined differential transconductance. As used herein "differential transconductance" refers to the ratio between drain current change and gate source voltage changes in the limit of small changes, i.e. the small signal transconductance.

The differential transconductance is monitored by observing the result of adding a small voltage offset to the control voltage. The control voltage with and without the added small voltage offset results in a substantially linear difference in main current through one or more of the reference transistors, with a size that is proportional to the voltage offset and the differential transconductance. The current difference is used as an input of the feedback circuit to control the control voltage.

The reference transistor or transistors may be an NMOS transistor or NMOS transistors for example, or a PMOS transistor or PMOS transistors, or a bipolar transistor or transistors. In the example of NMOS or PMOS transistors, the main current channel is the channel of the transistor and the control electrode is the gate, the control voltage being the gate-source voltage. In the example of bipolar transistors the emitter and collector are the terminals of the main current channel and the control electrode is the base.

In one embodiment a small time dependent oscillator signal may be used to provide the differential voltage offset, main currents at different time points being compared to each other to control the control voltage. In this embodiment a single reference transistor may suffice, so that inter transistor differences play no role in control of the differential transconductance.

In an embodiment a first and second reference transistor are used that match each other. In this case a small difference between the driving conditions of the first and second reference transistor may be used to assess the differential transconductance. The control voltage is fed to the control electrodes of both transistors, using an offset voltage source to impose the small differential voltage offset the between the control electrodes of the first and second transistor. The feedback circuit is configured to supply the control voltage in a feed back loop that makes the current from the offset current source equal to the difference between the main currents of the reference transistors. In this embodiment no time dependent oscillator needs to be applied to measure the differential transconductance.

In an embodiment one of the main currents may be fed to a circuit node via a current mirror for example, while the other main current is fed directly to the circuit node and the offset current can be supplied to the circuit node or added before the current mirror. This circuit node may be used as input for the feedback circuit. But any other way of combining the currents at a circuit node may be that results in a net current that is equal to a difference between the offset current and the difference between the main currents through the main current channels of the first and second reference transistor.

In a further embodiment two differential amplifiers are used that regulate the voltage at corresponding terminals (e.g. the drains or collectors) of the first and second reference transistors to a same reference voltage. Thus, current dependence on drain or collector voltage dependence, which might affect the accuracy of differential transconductance measurement, may be eliminated.

In an embodiment the differential voltage offset and the offset current based on a common reference, are driven proportionally to each other. Thus, the effect of variation of the differential voltage offset and the offset current on the resulting differential transconductance is avoided.

In an embodiment the output circuit of the reference source is configured to output a bias current at a level between the main currents of the first and second reference transistor. Due to non linearity the differential transconductance of the first and second reference transistor may be slightly different when a small main current difference is present. The predetermined differential transconductance will be reached somewhere between the main currents of the first and second reference transistors. Using an output bias current between the main currents reduces the deviation from the predetermined differential transconductance. A bias current midway between the main currents may be used for example.

In a further embodiment output bias current between the main currents is realized by means of a further offset current source configured to supply a further offset current smaller than the offset current, which is added to the output current. In a further embodiment this current is half the offset current that is used to control the differential transconductance.

BRIEF DESCRIPTION OF THE DRAWINGS

These and other objects and advantageous aspects will become apparent from a description of exemplary embodiments, using the following Figures.

DETAILED DESCRIPTION OF EMBODIMENTS

Figure 1:
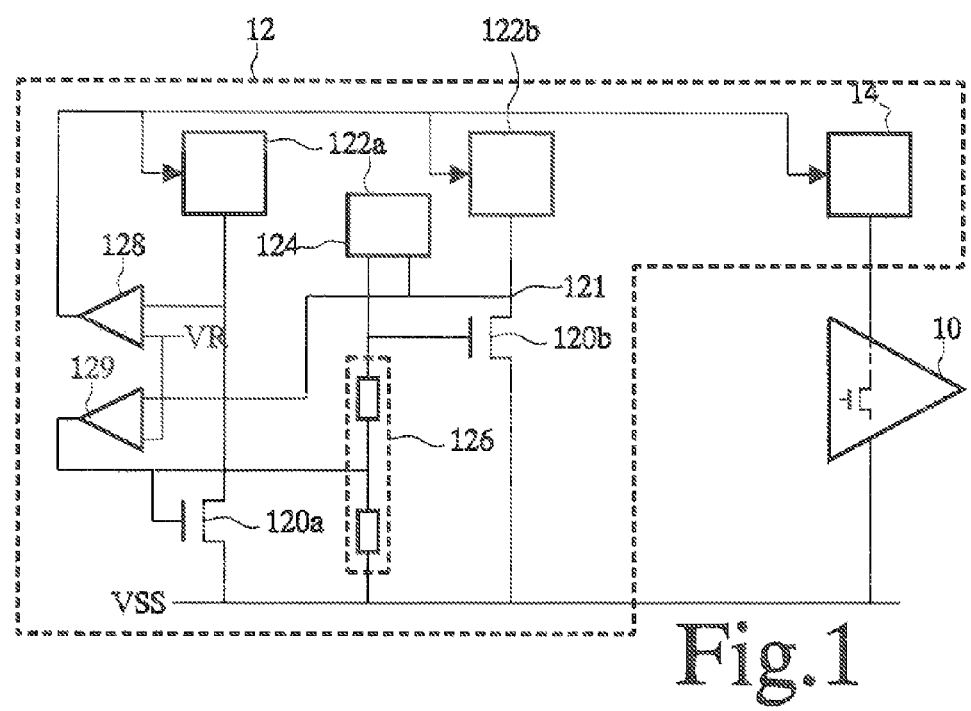
FIG. 1 shows a circuit with a reference circuit

FIG. 1 shows a circuit comprising an amplifier 10, a reference circuit 12 and a bias source 14. Reference circuit 12 has an output coupled to a control input of bias source 14. Bias source 14 has an output coupled to a bias input of amplifier 10. Reference circuit 12 is designed to adapt the bias so that a predetermined small-signal gain (differential transconductance) is realized. As used herein "differential transconductance" refers to the ratio between drain current change and gate source voltage changes in the limit of small changes, termed differential changes, which are so small that the ration corresponds at least more closely to the derivative of the drain current with respect to gate source voltage than to the ratio of total drain current change and gate source voltage. The voltage offset used to determine the differential transconductance is termed "differential voltage offset". The terms "differential transconductance" and "differential voltage" are not used to indicate or suggest that a differential circuit such as a differential amplifier must be used.

In the embodiment of FIG. 1 this is done by providing a matched pair of reference transistors with gate source voltages that differ by a small imposed voltage difference. In response, there will be a small amount of drain current difference between the drain currents of the reference transistors, corresponding to a product of the gate source voltage difference times the small signal gain (differential transconductance). The small signal gain depends on a commonly variable component of the gate source voltages. The reference circuit produces a net current that corresponds to the common component of the drain currents of the reference transistors minus a small reference current that is proportional to the small imposed voltage difference. The reference circuit adapts the commonly variable component of the gate source voltages of the reference transistors in response to this net current in a feedback loop. This has the effect that the amount of drain current difference corresponds to a predetermined small signal gain, equal to the ratio of the drain current difference and the imposed voltage difference.

Reference circuit 12 comprises a first reference transistor 120a, a second reference transistor 120b, drain current sources 122a,b, an offset current source 124, a voltage offset circuit 126, a first control amplifier 128 and a second control amplifier 129. First and second reference transistor 120a,b are NMOS transistors, each with a gate, which will be referred to as control electrode, and a drain and a source connected by the transistor channel, which will be referred to as the main current channel. The sources of first and second reference transistor 120a,b are coupled to a first supply terminal Vss. The drains of first and second reference transistor 120a,b are coupled to a first and second one of the drain current sources 122a,b respectively. Drain current sources 122a,b are constructed to supply equal currents to the drains. First and second reference transistor 120a,b are matched, in the sense that they are made of the same material and have equal W/L ratio. Preferably, matching is realized by using equal gate widths and by using equal gate lengths in both transistors and/or by realizing the two transistors in the same semi-conductor body, near to each other.

Offset current source 124 has outputs coupled to a node 12 coupled to the drain of second reference transistor 120b and to voltage offset circuit 126 respectively. Voltage offset circuit 126 is coupled to the gates of first and second reference transistor 120a,b and is configured to create an offset between the gate voltages of first and second reference transistor 120a,b, so that second reference transistor 120b receives a larger gate source voltage than first reference transistor 120a. Voltage offset circuit 126 may comprise a resistor coupled between the gates of the first and second reference transistor 120a,b, and coupled to offset current source 124 so that offset current from offset current source 124 flows through the resistor. Thus, an offset voltage equal to the offset current times a resistance value of the resistor is realized. In addition, voltage offset circuit 126 optionally comprises a current sink to sink the offset current or part of it.

First control amplifier 128 has inputs coupled to the drain of first reference transistor 120a and a reference input VR, and an output coupled to control inputs of drain current sources 122a,b. The sign of amplification is selected to drive the drain current sources 122a,b towards a level where the net current at the input of first control amplifier 128 is zero. Second control amplifier 129 has inputs coupled to a node 121 coupled to the drain of second reference transistor 120b and the reference input VR, and an output coupled to the gates of first and second reference transistor 120a,b via voltage offset circuit 126. The sign of amplification is selected to drive the commonly variable component towards a level where the net current at the input of second control amplifier 129 is zero.

In operation, offset current source 124 and voltage offset circuit 126 are used to operate first and second reference transistor 120a,b under slightly different conditions, so as to use the derivative of the drain current with respect to gate source voltage, in other words the transconductance, as a measured parameter in a control loop.

Second reference transistor 120b has a slightly larger gate-source voltage than first reference transistor 120a, due to voltage offset circuit 126 and a slightly larger drain current is supplied to the drain of second reference transistor 120b than to the drain of first reference transistor 120a, due to offset current source 124. By slightly different conditions, or small differences between voltages it is meant that the effects of the difference are substantially linear, e.g. that the deviation from the linear extrapolation from the theoretical response to infinitesimally small differences is less than, say, twenty percent and preferably less than ten percent. Thus, the observed differences in voltages substantially correspond to the differential transconductance, i.e. the derivative of main channel current with respect to control voltage, with no more than, say, twenty or preferably ten percent difference from the extrapolated transconductance for infinitesimally small signals.

First control amplifier 128 controls drain current sources 122a,b so that the drain voltage of first reference transistor 120a is driven to the reference voltage. Second control amplifier 129 controls the commonly variable component of the gate source voltages of first and second reference transistor 120a,b so that the drain voltage of second reference transistor 120b is driven to the reference voltage. In this way, the commonly variable component of the gate source voltages of first and second reference transistor 120*a,b* is controlled at a level that makes the predetermined offset between the gate source voltages under conditions of equal drain source voltage result in a predetermined offset between the drain currents of first and second reference transistor 120*a,b*. As first and second reference transistor 120*a,b* are matched, this corresponds to a predetermined differential transconductance of first and second reference transistor 120*a,b*.

Bias circuit 14 supplies a copy of the resulting current through first reference transistor 120*a* to amplifier 10 as a bias signal. In amplifier 10 this copied current is used to control the gain. A diode connected transistor (not shown) in amplifier 10 may be used for example to convert the current back into a gate source voltage bias inside amplifier 10. Alternatively, the gate source voltage of first or second reference transistor 120*a,b* may be fed directly to amplifier 10, or via a buffer, for use as a gate source bias signal. As another alternative further current mirrors may be used to copy the current to amplifier 10. Furthermore, a plurality of copies of the current may be supplied to amplifier 10, to realize a plurality of references.

Amplifier 10 may contain one or more transistors that are copies of first and second reference transistor 120*a,b* and which are biased with copies of the gate source voltage of first or second reference transistor 120*a,b*. In another embodiment amplifier 10 may contain one or more transistors that are scaled copies of first and second reference transistor 120*a,b* and which are biased with copies of the gate source voltage of first or second reference transistor 120*a,b*. However, at small transistor size geometric scaling may not result in scaled electric properties. In this case it is preferable to use a reference circuit 12 with first and second reference transistor 120*a,b* that are substantially copies of the transistors in amplifier 10 for which they are used to generate the bias.

In an embodiment, in addition to amplifier 10 at least one further amplifier may be provided, amplifier 10 and the at least one further amplifier receiving the bias current generated by reference circuit 12.

It may be noted that, when the offset between the gate-source voltages is created by a first offset current through a resistor, the reference for the transconductance is set by the resistance value of the resistor and the ratio between the first offset current and a second offset current supplied to the drain of second reference transistor 120*b*. Offset current source 124 imposes a predetermined ratio between the first and second offset current to set a predetermined reference for the differential transconductance.

Apart from this ratio the size of the first and second offset current is not determinative. Preferably the size is kept so small that non-linear response effects of first and second reference transistor 120*a,b* are negligible, for example less than 20 percent of the linear effect of the response to the offset between the gate source voltages. As shown, offset current source 124 may be independent of the drain current supplied by drain current sources 122*a,b*. This has the advantage that the offset can be kept fixed and small even if the drain currents vary. In an alternative embodiment, offset current source 124 may be configured to supply an offset current that is proportional to the drain current of reference transistors 120*a,b*.

As the differential transconductance depends on the ratio of the offset voltage and the offset current, this may not influence control of the differential transconductance in some circuits. In this case, instead of using an drain offset current, the width of one of the reference transistors 120*a,b* may be made different from that of the other, so that the current densities of reference transistors 120*a,b* differ. This may be used to regulate differential transconductance, in combination with a drain current dependent gate-source voltage offset. In an alternative embodiment, current sources 122*a,b* may be configured currents at a predetermined ratio unequal to one. However, for small size transistors current density changes may not have the same proportionality to drain current changes of matching transistors for all bias conditions. Therefore use of a drain current offset and matching transistors may be preferred when the differential transconductance is regulated.

Figure 2:
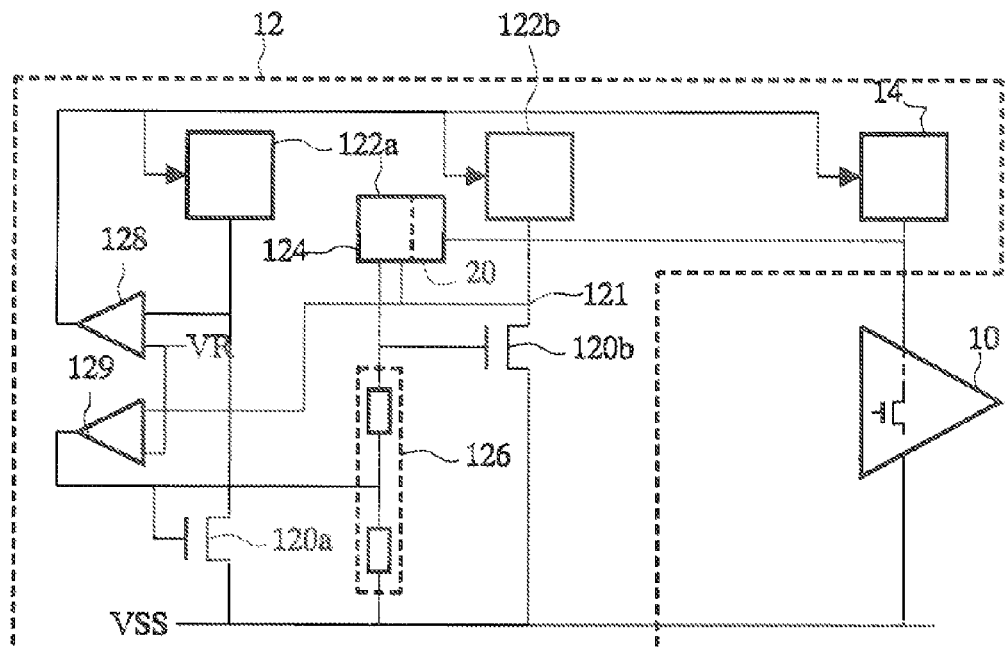
FIG. 2 shows an embodiment with a parallel supply current source

FIG. 2 shows an embodiment wherein an added part 20 of offset current source 124 supplies a parallel current to amplifier 10 in parallel with bias circuit 14. The parallel current is half the offset current supplied to second reference transistor 120*b*. In this embodiment half the offset current supplied to second reference transistor 120*b* is added to the current supplied to amplifier 10. In this way the effect of non-linear behavior of first or second reference transistor 120*a,b* on the deviation between the set value of the differential transconductance and the transconductance realized in a transistor (not shown) in amplifier 10 is alleviated. Instead of a half current, any other current between zero and the offset current may be used, but half the current is expected work best under varying circumstances to approximate the desired differential transconductance.

It may be noted that first control amplifier 128 and drain current sources 122 function as a current mirror circuit, with an input coupled to the drain of first reference transistor 120*a*. As shown, this current mirror circuit is designed to make the voltage at its input equal to the reference voltage that is maintained at the drain of second reference transistor 120*b*. In this way, the effect of drain voltage differences on the difference between the drain current is eliminated when the differential transconductance is controlled.

It may furthermore be noted that various alternative configurations are possible. For example, instead of the current mirror circuit formed by first control amplifier 128 and drain current sources 122 may be replaced by a current mirror with an input coupled to the drain of second reference transistor 120*b* and an output coupled to second reference transistor 120*b*, in which case first control amplifier 128 may have its input coupled to the drain of first reference transistor 120*a*. First control amplifier 128 may have its input coupled to the input of the current mirror if its input impedance is not too low. Similarly, the offset between the drain currents may be introduced in various ways, for example using a current source in parallel with first reference transistor 120*a*. Furthermore, the commonly variable offset between the gate voltage may be controlled for example by means of a controllable voltage source, or voltage sources coupled between the sources of reference transistors 120*a,b* and the supply conductor Vss. However, in some applications this may be disadvantageous because it introduces a variable back gate bias. Similarly, the voltage offset may be introduced by means of a voltage source between the source of one of the reference transistors 120*a,b* and the supply conductor Vss. However, in some applications this may be disadvantageous because it introduces a variable back gate bias.

Figure 3:
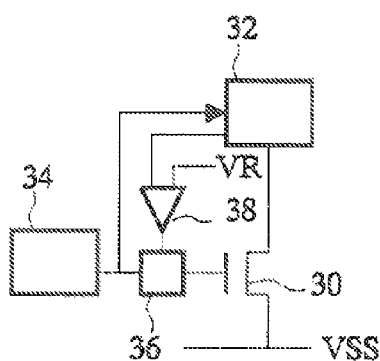
FIG. 3 shows a reference circuit with a single reference transistor

FIG. 3 shows an embodiment of a reference circuit with a single reference transistor 30. The reference circuit comprises a detector/load circuit 32 an AC signal generator 34, an adder 36 and a control amplifier 38. The drain of reference transistor 30 is coupled to an input of detector/load circuit 32. Adder 36 has an output coupled to the gate of reference transistor 30 and inputs coupled to outputs of AC signal generator 34 and an output of detector 32 via control amplifier 38. Detector 32 has a further input to AC signal generator 34.

In operation, adder 36 applies a sum of a bias voltage derived from control amplifier 38 and an AC voltage from AC signal generator 34 to the gate of reference transistor 30. In response the drain current of reference transistor 30 has an AC component, which is detected by detector 32. Detector 32 may be configured to keep a voltage at the drain of reference transistor 30 substantially constant. In response to the detected AC current component, control amplifier 38 drives the bias voltage to a level at which the AC component of the drain current has a predetermined detected amplitude.

Thus control of the AC differential transconductance of reference transistor 30 is realized. In an embodiment, the DC drain current component of the drain current of reference transistor 30 may be copied, using a current mirror (not shown) with an input in series with the drain of reference transistor 30, to provide bias to the amplifier (not shown). Detector 32 may have an input coupled to the input of this current mirror (not shown). In another embodiment, control amplifier 38 may have a diode coupled transistor at a current output to form the bias voltage at the grate of the diode coupled transistor. In this case the diode coupled transistor may be used as the input of a current mirror that provides bias to the amplifier (not shown).

It may be noted that the circuit of FIG. 3 has the disadvantage that it needs AC signal generation to generate the reference, which may result in interference. On the other hand it has the advantage that a single reference transistor determines the differential transconductance setting, so that possible discrepancies between reference transistors have no effect.

Although an exemplary embodiment using NMOS reference transistors has been shown it should be appreciated that other types of reference transistors may be used, such as PMOS transistors or bipolar transistors. In the latter case the collector-emitter connection functions as main current channel of the reference transistor instead of the channel of the NMOS transistor and the base functions as control electrode instead of the gate.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A circuit comprising a reference source for supplying a bias signal to set a differential transconductance of an amplifier transistor in an amplifier to a predetermined value, the reference source comprising:
   at least one reference transistor, comprising a control electrode and a main current channel;
   a feedback circuit with an input coupled to the main current channel of the reference transistor or reference transistors and an output coupled to the control electrode of the reference transistor or reference transistors, configured to control a control voltage at the control electrode, the feedback circuit being configured to equalize an offset current and a difference between main currents flowing through the current channel of the reference transistor or reference transistors, obtained with and without a differential voltage offset added to the control voltage;
   an output circuit coupled to the at least one reference transistor and configured to supply a bias signal derived from the reference transistor or reference transistors to an output of the reference source.

2. A circuit according to claim 1, comprising:
   wherein the at least one reference transistor includes a first and second reference transistor, matching each other;
   an offset voltage source coupled between the control electrodes of the first and second reference transistors, for applying the differential voltage offset between the control electrodes of the first and second reference transistors;
   an offset current source for supplying the offset current;
   the feedback circuit being configured to regulate a difference between the offset current and the difference between the main currents through the main current channels of the first and second reference transistors to zero by adapting the control voltage.

3. A circuit according to claim 2, comprising:
   a first and second controllable current source with outputs coupled to corresponding terminals of the main current channels of the first and second reference transistors respectively;
   a first differential amplifier with a first and second input and an output coupled to control inputs of the first and second controllable current sources, the first input coupled to a terminal of the main current channel of the first reference transistor;
   the feedback circuit comprising a second differential amplifier with a first and second input and an output coupled to the control electrodes of the first and second reference transistors, the first input coupled to a circuit node configured to receive a net current equal to the difference between the offset current and the difference between the main currents through the main current channels of the first and second reference transistors, the second inputs of the first and second differential amplifiers being coupled to receive a same reference voltage.

4. A circuit according to claim 2, comprising an offset circuit comprising the offset voltage source and the offset current source, and configured to drive the differential voltage offset and the offset current based on a common reference, proportionally to each other.

5. A circuit according to claim 2, wherein the output circuit is configured to output a bias current at a level between the main currents of the first and second reference transistors to the output of the reference source.

6. A circuit according to claim 5, wherein the output circuit of the reference source comprises a further offset current source configured to supply a further offset current smaller than the offset current, the output circuit being configured to add the further offset current to a copy of the main current of the first transistor to form the output current.

7. A circuit according to claim 2, wherein the further offset current source is configured to supply the further offset equal to half the offset current.

8. A circuit according to claim 1, comprising an oscillator circuit coupled to the control electrode of the at least one reference transistor, the feedback circuit being configured to determine said difference between the main currents from current obtained in response to an oscillator signal from the oscillator circuit added to the control voltage.

9. A circuit according to claim 1, comprising the amplifier with the amplifier transistor coupled to an output of a current mirror with an input that receives the current from the output of the output circuit of the reference source.

10. A method of amplifying signals, wherein a differential transconductance of an amplifying transistor of an amplifier is controlled, the method comprising:

controlling a control voltage at a control electrode of at least one reference transistor in a feedback loop to equalize an offset current and a difference between main currents flowing through the current channel of the reference transistor or reference transistors obtained when a differential voltage offset is added to the control voltage;

using a current and/or voltage derived from the at least one reference transistor to bias the amplifying transistor.

* * * * *